US012787682B2

(12) United States Patent
Na et al.

(10) Patent No.: US 12,787,682 B2
(45) Date of Patent: Nov. 3, 2026

(54) SEMICONDUCTOR MANUFACTURING APPARATUS

(71) Applicant: NEXTIN, INC., Gyeonggi-do (KR)

(72) Inventors: Seoung-Ju Na, Gyeonggi-do (KR); Heung-Gyoon Park, Gyeonggi-do (KR); Keun Young Lim, Gyeonggi-do (KR); Moo Hwan Kim, Gyeonggi-do (KR)

(73) Assignee: NEXTIN, INC., Gyeonggi-do (KR)

( * ) Notice: Subject to any disclaimer, the term of this patent is extended or adjusted under 35 U.S.C. 154(b) by 546 days.

(21) Appl. No.: 18/260,566

(22) PCT Filed: Jun. 23, 2022

(86) PCT No.: PCT/KR2022/008951
§ 371 (c)(1),
(2) Date: Jul. 6, 2023

(87) PCT Pub. No.: WO2022/270945
PCT Pub. Date: Dec. 29, 2022

(65) Prior Publication Data

US 2024/0071785 A1 Feb. 29, 2024

(30) Foreign Application Priority Data

Jun. 24, 2021 (KR) ........................ 10-2021-0082660

(51) Int. Cl.
*H01L 21/67* (2006.01)
*H01J 37/32* (2006.01)
(Continued)

(52) U.S. Cl.
CPC .... *H10P 72/0436* (2026.01); *H01J 37/32568* (2013.01); *H10P 72/7626* (2026.01); *H01J 2893/0016* (2013.01)

(58) Field of Classification Search
CPC .......... H01L 21/67115; H01L 21/68792; H01J 37/32; H01J 37/32422; C23C 16/45536; C23C 16/48
See application file for complete search history.

(56) References Cited

U.S. PATENT DOCUMENTS 9,017,526 B2 4/2015 Singh et al.
9,230,819 B2 1/2016 Paterson et al.
(Continued)

FOREIGN PATENT DOCUMENTS

CN 111261498 A 6/2020
JP 1985/212220 A 10/1985
(Continued)

OTHER PUBLICATIONS

Masakazu, JP04/181647, Eng machine translation, Jun. 1992 (Year: 1992).*
(Continued)

*Primary Examiner* — Joseph A Miller, Jr.
(74) *Attorney, Agent, or Firm* — Renner, Otto, Boisselle & Sklar, LLP; Christopher P. Harris

(57) ABSTRACT

A semiconductor manufacturing apparatus according to an embodiment of the present invention comprises: an ultraviolet generating part which is disposed in an ultraviolet generating chamber and generates ultraviolet rays of a target wavelength; a substrate driving part including a chuck which is disposed in a process chamber where a substrate fed therein is treated with ultraviolet rays and supports the fed substrate, and an axis which rotates and moves up and down the chuck; and a window which is disposed between the ultraviolet generating chamber and the process chamber and transmits the generated ultraviolet rays to the process chamber.

11 Claims, 9 Drawing Sheets

(51) Int. Cl.
*H10P 72/00* (2026.01)
*H10P 72/76* (2026.01)

(56) References Cited

U.S. PATENT DOCUMENTS

| | | | | |
|---|---|---|---|---|
| 9,406,535 | B2 | 8/2016 | Berry, III et al. | |
| 9,960,030 | B2 | 5/2018 | Razek | |
| 2007/0228618 | A1* | 10/2007 | Kaszuba | H01L 21/67115 264/494 |
| 2011/0002674 | A1 | 1/2011 | Shimizu | |
| 2013/0015757 | A1* | 1/2013 | Hegde | H01J 37/32669 313/231.31 |
| 2013/0026381 | A1* | 1/2013 | Huang | G01J 1/429 356/213 |
| 2014/0116335 | A1 | 5/2014 | Tsuji et al. | |

FOREIGN PATENT DOCUMENTS

| | | | |
|---|---|---|---|
| JP | 1986/216328 | A | 9/1986 |
| JP | 04-080372 | A | 3/1992 |
| JP | 04-181647 | A | 6/1992 |
| JP | 2006-216583 | A | 8/2006 |
| JP | 2008-547217 | A | 12/2008 |
| JP | 2013/122966 | A | 6/2013 |
| JP | 2014/229751 | A | 12/2014 |
| KR | 2004-0040106 | A | 5/2004 |
| KR | 10-2017-0001817 | A | 1/2017 |
| KR | 10-1698273 | B1 | 1/2017 |
| KR | 10-2021-0075254 | A | 6/2021 |
| KR | 10-2322101 | B1 | 11/2021 |
| KR | 10-2358914 | B1 | 2/2022 |
| TW | 201433374 | A | 9/2014 |
| TW | 201507022 | A | 2/2015 |
| TW | 201517162 | A | 5/2015 |
| TW | 201626482 | A | 7/2016 |

OTHER PUBLICATIONS

International Search Report and Written Opinion issued in connection with corresponding PCT Patent Application No. PCT/KR2022/008951 dated Oct. 21, 2022.

Taiwan Application No. 112118425; Taiwan Office Action issued Apr. 8, 2024; 9 pgs.

Japanese Patent Application No. 2023-543090; Japanese Office Action dated Jul. 9, 2024; 4 pgs.

* cited by examiner

【Figure 1】
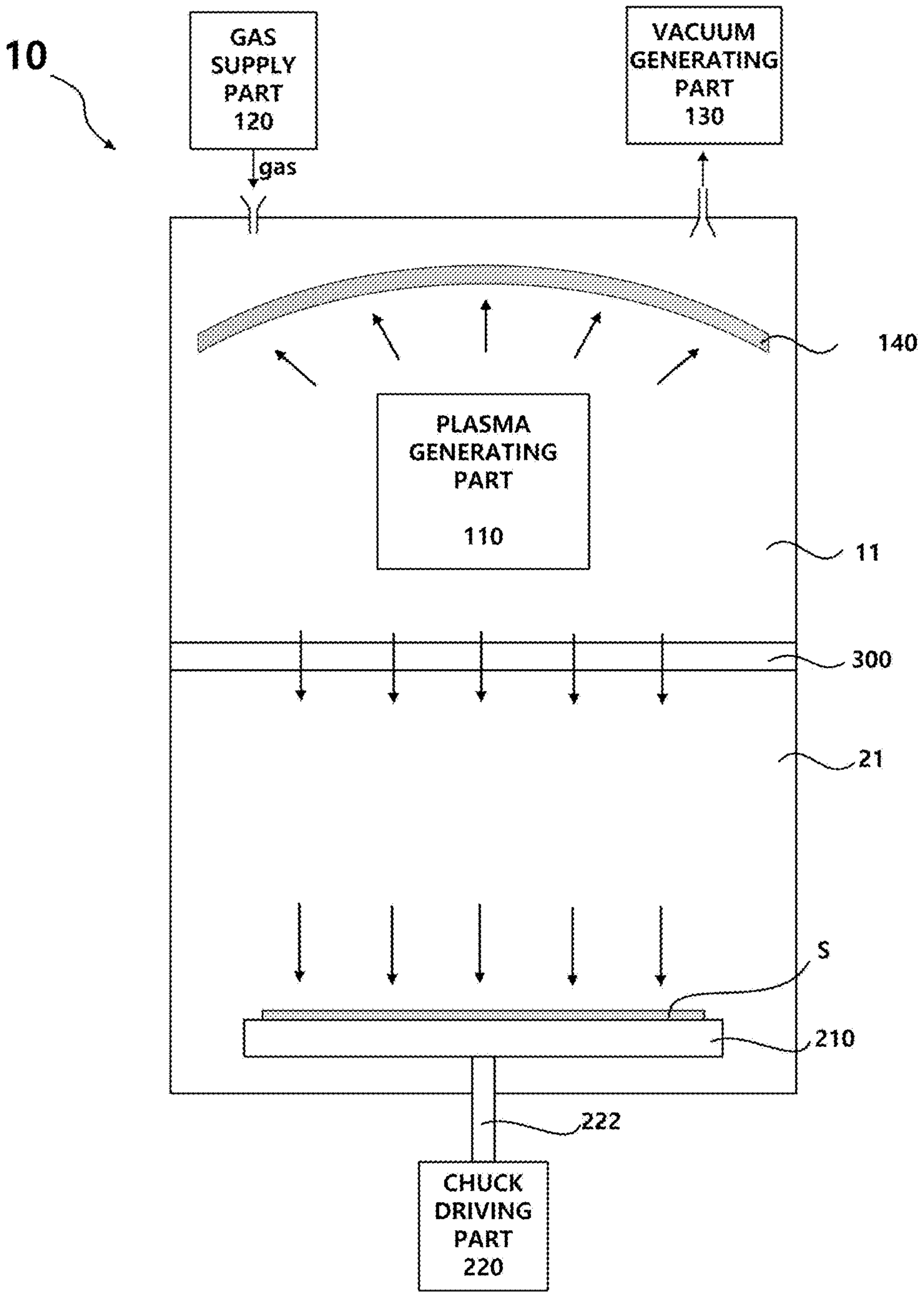

【Figure 2】
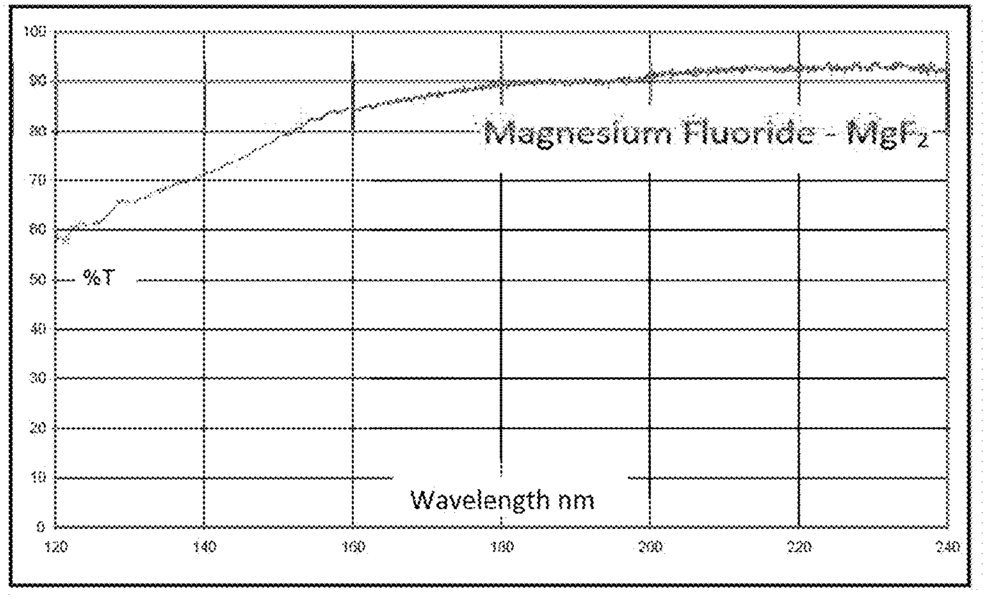
(a)
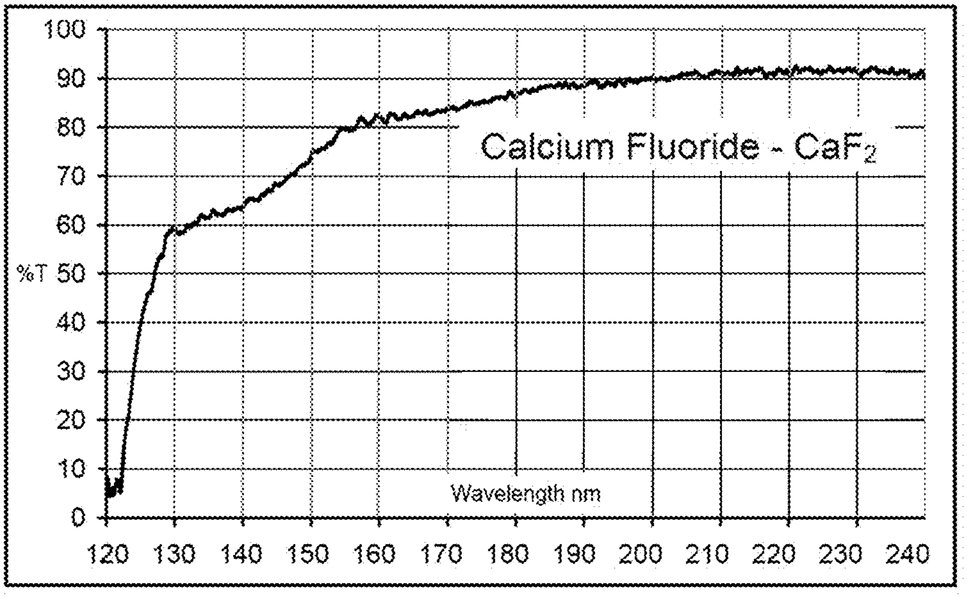
(b)

【Figure 3】
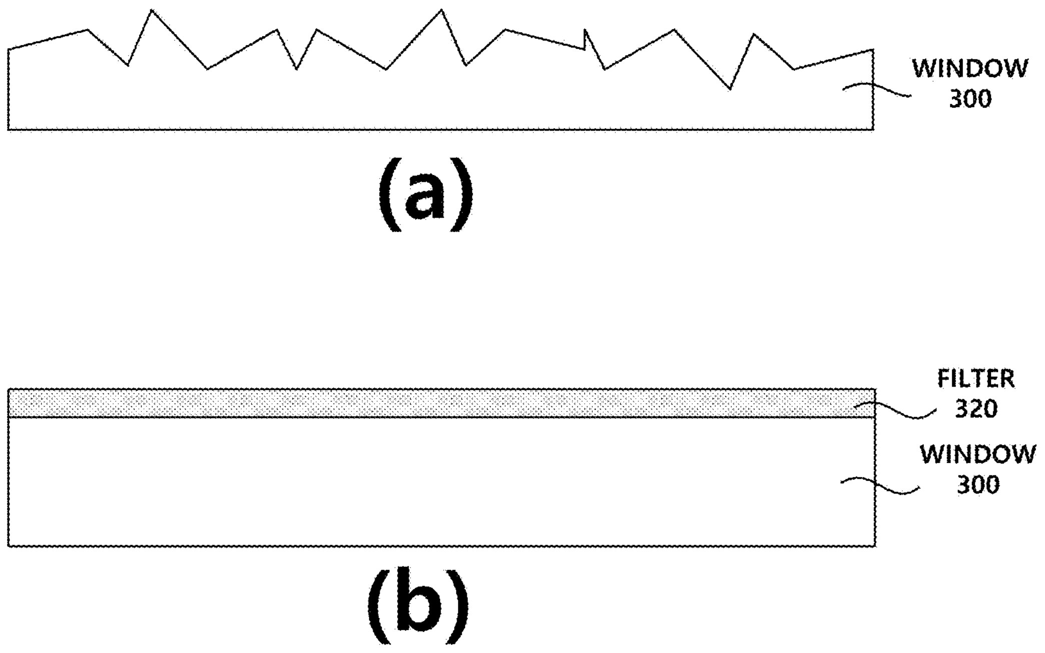

【Figure 4】
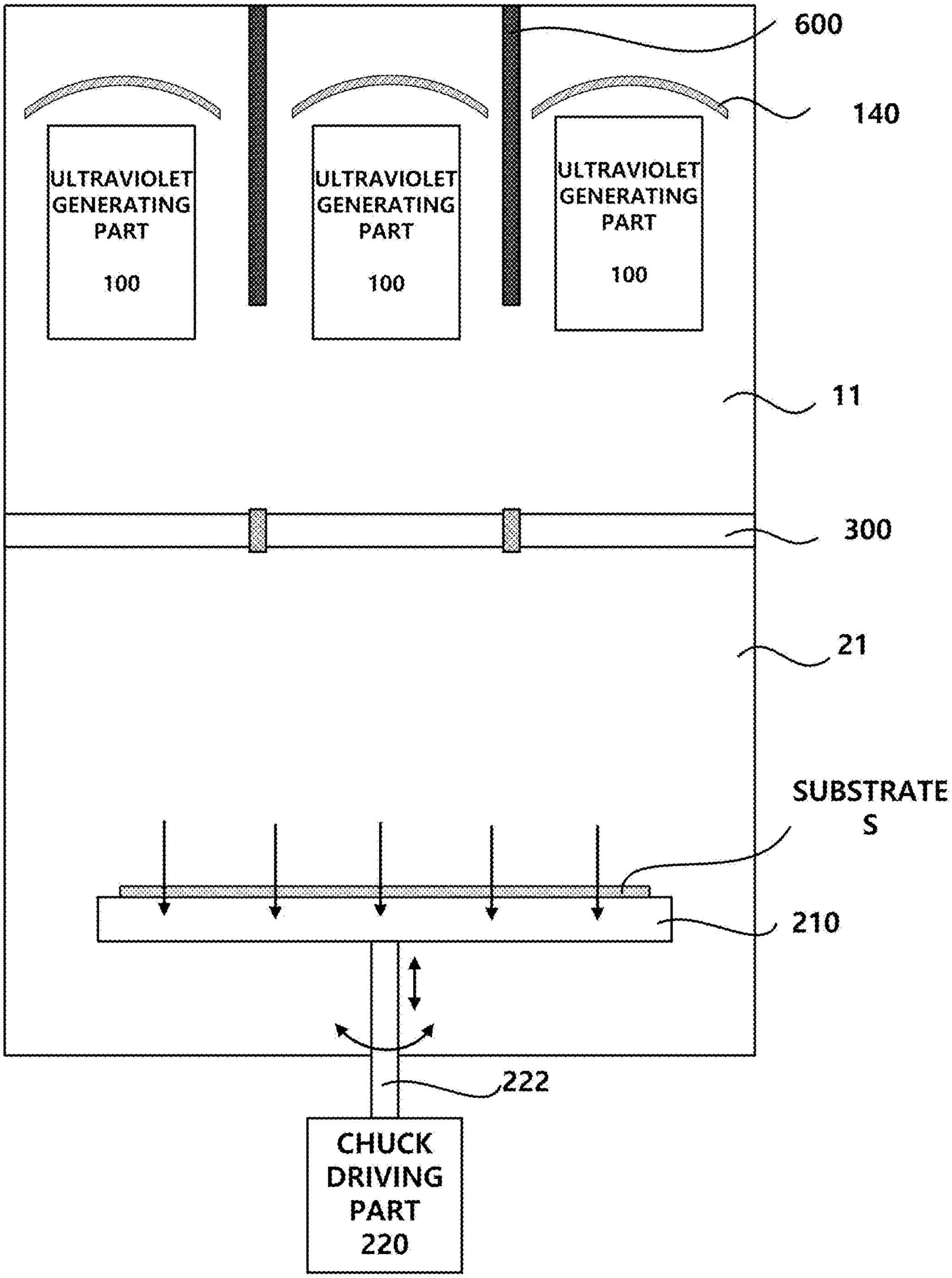

【Figure 5】
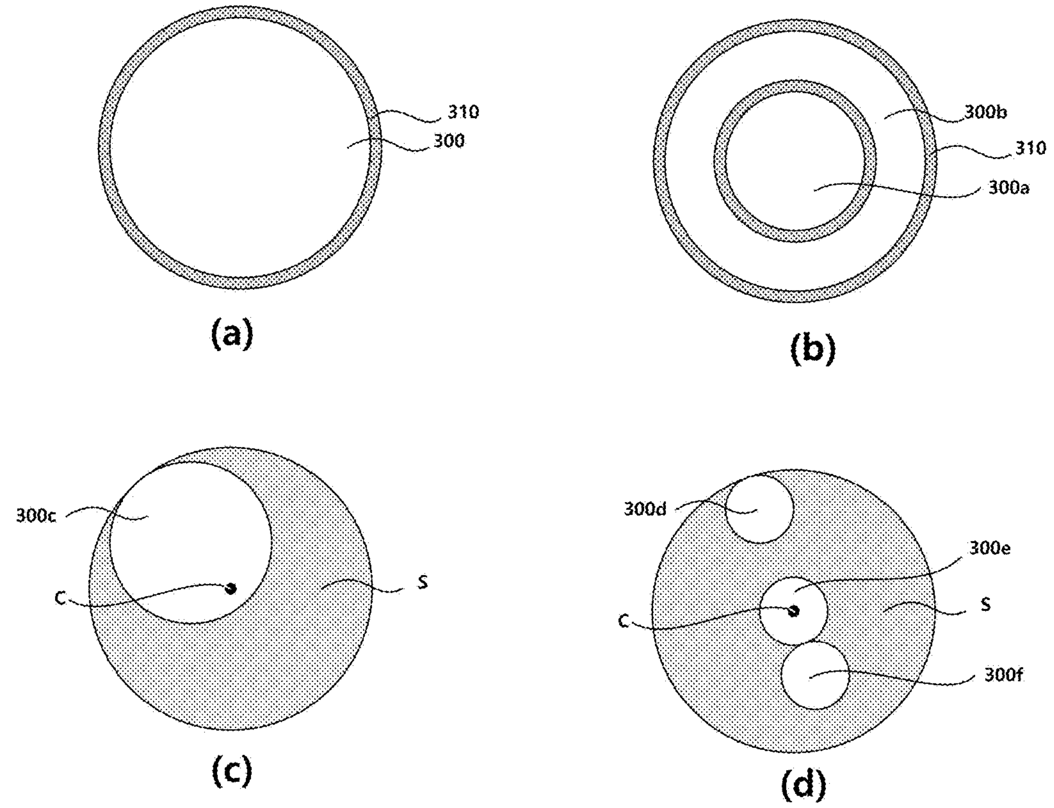

【Figure 6】
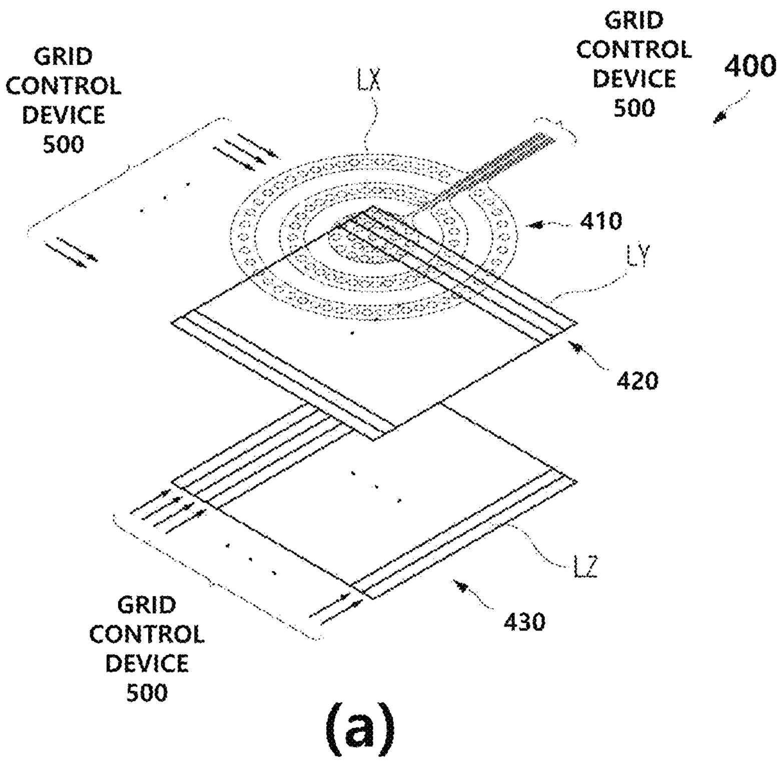
(a)
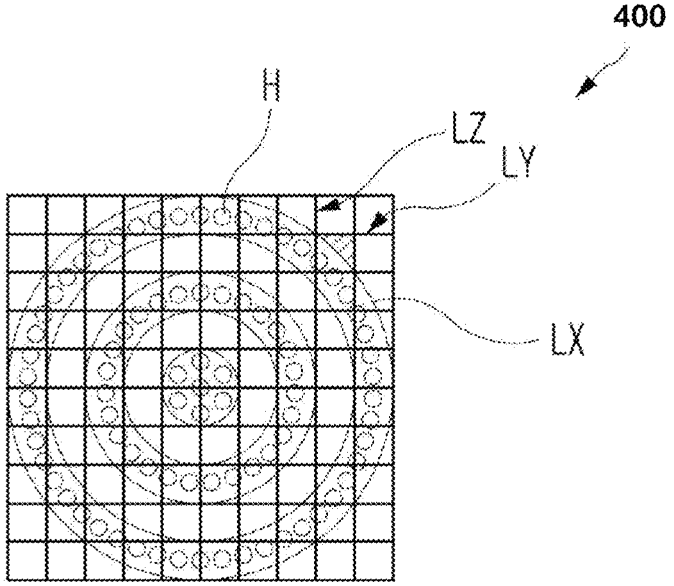
(b)

【Figure 7】
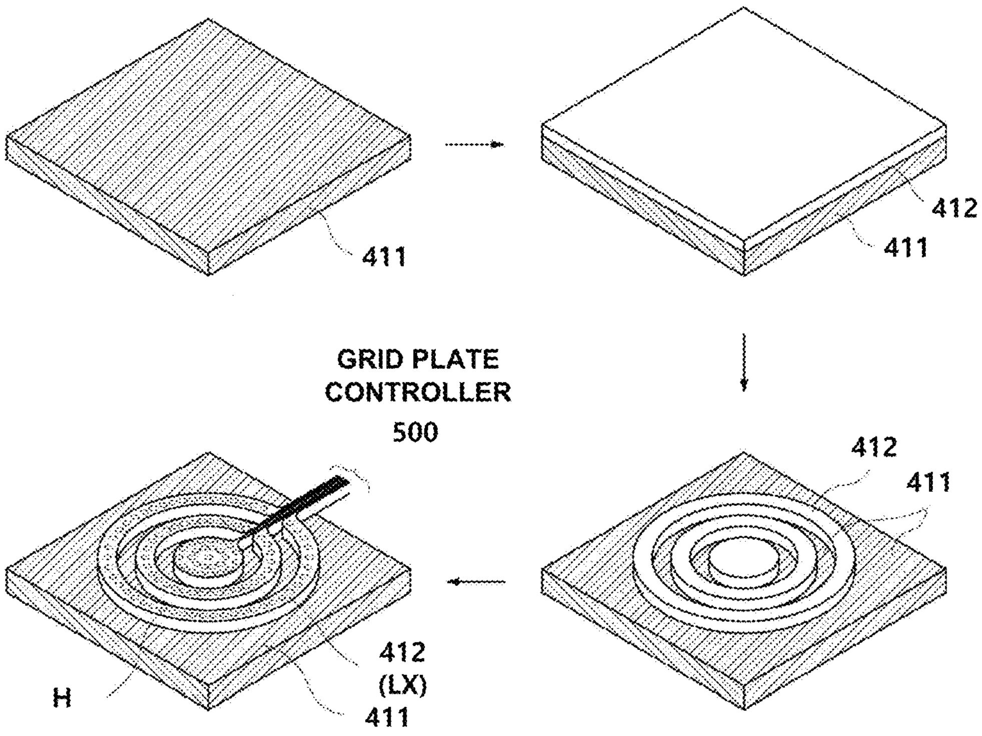

【Figure 8】
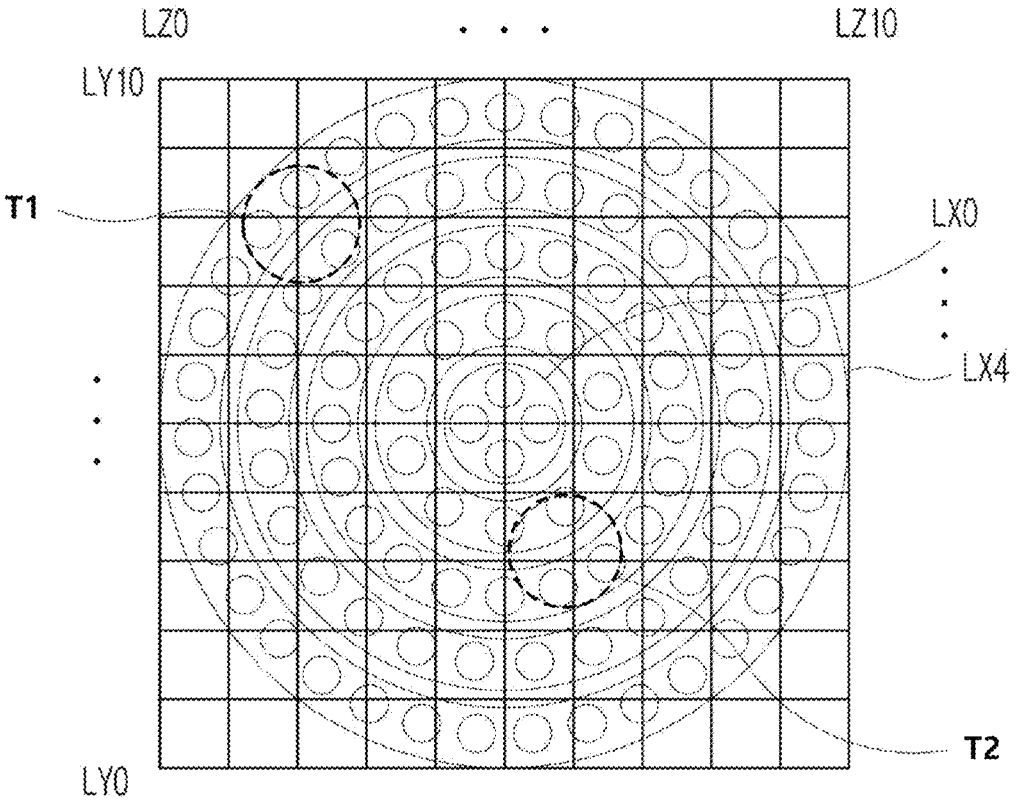

【Figure 9】
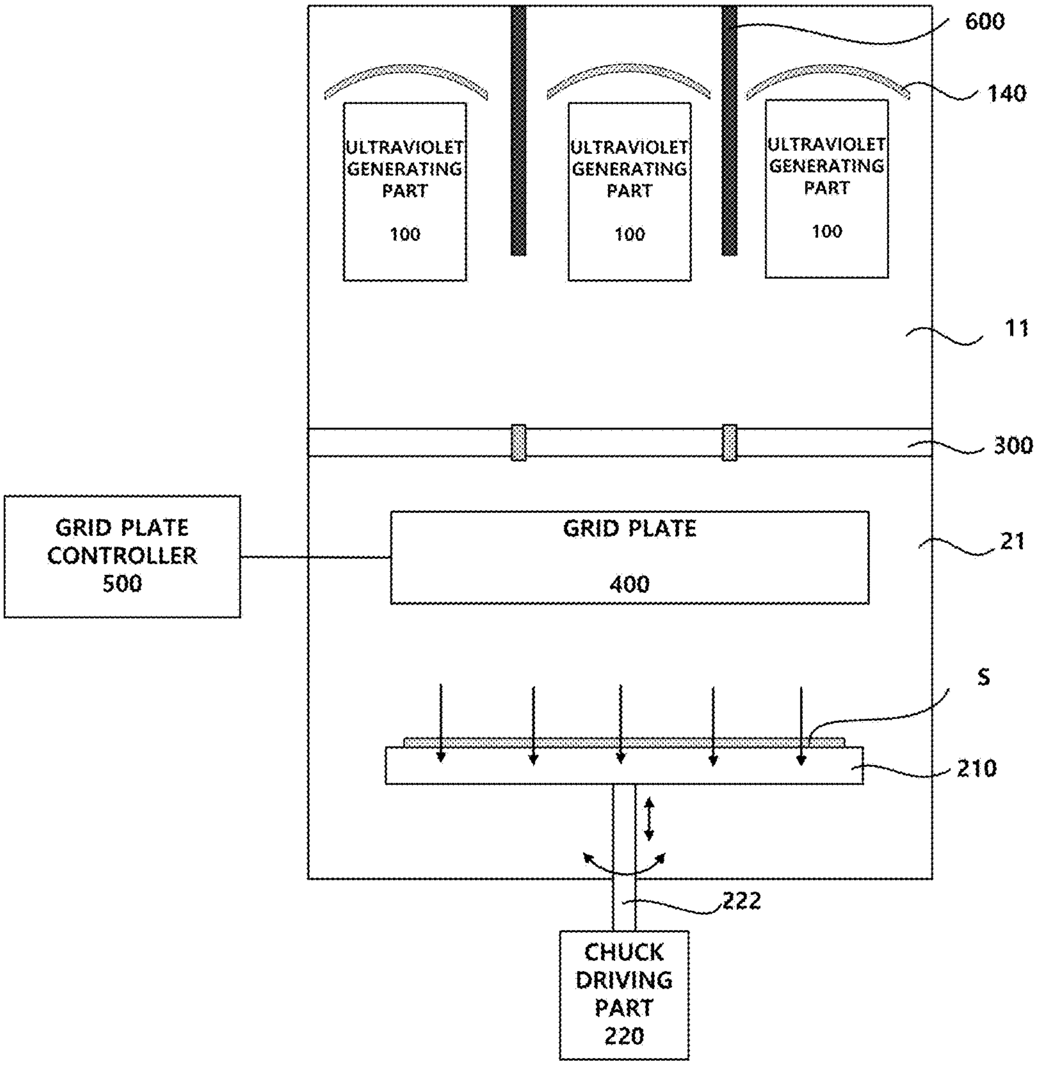

SEMICONDUCTOR MANUFACTURING APPARATUS

RELATED APPLICATIONS

The present invention is a U.S. National Stage under 35 USC 371 patent application, claiming priority to PCT Application No. PCT/KR2022/008951, filed on Jun. 23, 2022, which claims priority from Korean Patent Application No. 10-2021-0082660 filed on Jun. 24, 2021; the entireties of both are hereby incorporated herein by reference.

TECHNICAL FIELD

The present technology relates to a semiconductor manufacturing apparatus.

BACKGROUND ART

Recently, as the integration of the semiconductor industry increases, the size and area of a semiconductor element tend to decrease. Accordingly, the size of a pattern which forms the semiconductor element and the thickness of a thin film have decreased, and specifically, factors that have not had a significant influence in the related art are emerging as important factors in the development of the semiconductor element. One of these factors includes static electricity generated on a substrate.

The causes of static electricity generated on the semiconductor substrate include use of deionized water, and charge transfer, induction charging (charge), or the like from a charged plastic material.

It is known that the static electricity of the semiconductor substrate is mainly generated in a photo process or a cleaning process using a rotational motion, and the static electricity is mostly concentrated in a center portion due to a difference in a centrifugal force. That is, in a photo resist coating process, since the concentration of an air flow in the center portion of the substrate increases three times or more compared to an outer periphery due to high-speed rotation of a wafer, static electricity is generated around the center portion where the centrifugal force is relatively weak. Static electricity caused by a strong electric field generated in the center portion is charged on a surface of the wafer, the inside of a multilayer film on the surface, and a photoresist pattern formed on the surface.

When the semiconductor substrate is charged with a high voltage around the center portion thereof, in a region corresponding to the center portion of the substrate, not only the charge is charged on a semiconductor substrate surface such as a photoresist pattern, an oxide film, or the like which is an insulator, but also the charge is charged to a predetermined depth from the substrate surface, and thus a state in which neutralization by ions having low kinetic energy is impossible can occur. An electrostatic voltage charged on the semiconductor substrate has many variables such as the type of process, material, and pattern shape, and is generally generated between −100 V and +100 V.

For example, when a charging voltage of 100 V or less is generated on the semiconductor substrate, such as an insulating film in a microcircuit of 10 nm, a pattern P having an aspect ratio of “5” or more, or the like is formed, since a pattern width is narrow, there is difficulty in removing static electricity accumulated in the thin film due to a self-neutralization effect between positive ions and negative ions generated from an ionizer and the reduction of ion collision caused by a low electromotive force according to a low voltage difference between the semiconductor substrate and the ions.

A decay time within 1 to 2 seconds is required to reduce the static electricity charged with 1000 V on the semiconductor substrate to 100 V or less using a soft X-ray ionizer. However, when an initial charging voltage of 100V or less is generated, it takes a long time to reduce the charging voltage to a target voltage or less.

Further, considering that an ion density of the ionizer is generally $10^6$, when charging occurs inside an oxide film under a photoresist in the semiconductor substrate and the ion density becomes $10^8$ or more, the static electricity generated on the semiconductor substrate cannot be removed using a conventional ionizer.

In this case, there may be a method of removing the static electricity of the semiconductor substrate by generating high-density plasma of $10^9$ or more in a vacuum chamber.

However, in the case of a vacuum chamber configuration, a problem in that ions are additionally charged on the entire surface may occur due to self-bias and plasma uniformity according to a plasma type. Further, a microcircuit may be generated in an irregular pattern on the semiconductor substrate, and static electricity of different voltages can be respectively charged in parts according to characteristics of the pattern. That is, an electrostatic voltage of −20 to −50 V or higher may be distributed depending on the portion of the semiconductor substrate.

Accordingly, when ions are uniformly supplied to the substrate, ions of the same intensity are emitted to the semiconductor substrate over the entire surface of the substrate, and accordingly, charging by overshooting may additionally occur in a region to which a voltage level higher than that of the electrostatic voltage generated on the semiconductor substrate is applied.

Furthermore, ions should be provided with high energy to neutralize static electricity when charges are charged in the oxide film and/or the pattern, but when reactive radicals and/or reactive ions are irradiated to the substrate with high energy, the ions can collide with the substrate and the pattern formed on the surface to generate damage.

Specifically, in the case of a semiconductor substrate having a miniaturized structure with a pattern is 10 nm or less, charging by positive ions, negative ions, or electrons has a greater influence on the performance and yield of a semiconductor element.

In this regard, in Related Art Document 1 (Korean Patent Registration No. 10-1698273) and Related Art Document 2 (Korean Laid-Open Patent No. 10-2004-0040106), a configuration for removing static electricity from a semiconductor substrate using an ionizer is disclosed.

DISCLOSURE

Technical Problem

The embodiment is provided to solve the above-described difficulties of the related art. That is, the embodiment is directed to providing an apparatus which neutralizes static electricity generated on a semiconductor substrate and a pattern disposed on the substrate.

Technical Solution

A semiconductor manufacturing apparatus according to the embodiment includes: an ultraviolet generating part disposed in an ultraviolet generating chamber to generate ultraviolet rays of a target wavelength; a substrate driving part including a chuck disposed in a process chamber where a loaded substrate is treated with the ultraviolet rays to support the loaded substrate, and a shaft configured to rotate the chuck; and a window disposed between the ultraviolet generating chamber and the process chamber to transmit the generated ultraviolet rays to the process chamber.

According to any one aspect of the embodiment, the ultraviolet generating part may further include one or more reflective members configured to reflect the generated ultraviolet rays to the process chamber.

According to any one aspect of the embodiment, the ultraviolet generating part may generate plasma to generate the ultraviolet rays of the target wavelength, and may include a plasma generating part, a gas supply part, and a vacuum generating part forming a vacuum inside the ultraviolet generating chamber.

According to any one aspect of the embodiment, the gas supply part may provide one or more of helium (He), oxygen ($O_2$), and argon (Ar) gases.

According to any one aspect of the embodiment, the ultraviolet generating part may generate pulse-time-modulated plasma to generate the ultraviolet rays of the target wavelength.

According to any one aspect of the embodiment, the plasma generating part may include any one of a capacitively coupled plasma (CCP) generator, an inductively coupled plasma generator, and a microwave application device.

According to any one aspect of the embodiment, in the window, a pattern may be formed on at least one surface of the window, or a filter may be formed on at least one surface of the window.

According to any one aspect of the embodiment, at least a portion of the window may be formed of a material including any one of sapphire, magnesium fluoride ($MgF_2$), calcium fluoride ($CaF_2$), and lithium fluoride (LiF).

According to any one aspect of the embodiment, the semiconductor manufacturing apparatus may include a plurality of ultraviolet generating parts.

A semiconductor manufacturing apparatus according to the embodiment includes: an ultraviolet generating part disposed in an ultraviolet generating chamber to generate ultraviolet rays of a target wavelength; a substrate driving part including a chuck disposed in a process chamber where a loaded substrate is treated with the ultraviolet rays to support the loaded substrate, and a shaft configured to rotate the chuck; a window disposed between the ultraviolet generating chamber and the process chamber to transmit the generated ultraviolet rays to the process chamber; and a grid plate configured to accelerate and provide charged particles to the substrate, wherein the grid plate includes a plurality of electrode lines having different radii, and a grid electrode in which a plurality of holes are respectively formed in the electrode lines.

According to any one aspect of the embodiment, the grid plate may further include a grid electrode extending in a first direction, and a grid electrode extending in a second direction which is a direction different from the first direction.

According to any one aspect of the embodiment, the semiconductor manufacturing apparatus may further include a grid plate controller configured to supply a voltage corresponding to an electrostatic voltage generated on the substrate to the grid plate.

Advantageous Effects

According to the embodiment, an advantage in that static electricity generated on a semiconductor substrate and a pattern disposed on the substrate can be neutralized is provided.

DESCRIPTION OF DRAWINGS

FIG. 1 is a cross-sectional view illustrating an outline of a semiconductor manufacturing apparatus according to the embodiment.

FIG. 2(*a*) is a view illustrating the transmittance of magnesium fluoride, which is one of the materials of a window, by ultraviolet wavelength band, and FIG. 2(*b*) is a view illustrating the transmittance of calcium fluoride, which is one of the materials of the window, by ultraviolet wavelength band.

FIG. 3(*a*) is a view illustrating a state in which a pattern is formed on one surface of a window 300, and FIG. 3(*b*) is a view illustrating a state in which a filter 310 is formed on any one surface of the window.

FIG. 4 is a view illustrating another embodiment of the semiconductor manufacturing apparatus.

FIGS. 5(*a*) to 5(*d*) are plan views of embodiments of the window.

FIG. 6 is an exploded perspective view illustrating an outline of a grid plate.

FIG. 7 is a view schematically illustrating a process of manufacturing a first grid electrode.

FIG. 8 is a view illustrating a shape in which first to third grid electrodes are disposed and stacked, when viewed from above.

FIG. 9 is a view for describing an operation of the semiconductor manufacturing apparatus according to a preferable implementation example.

MODES OF THE INVENTION

Hereinafter, the embodiment will be described with reference to the accompanying drawing. FIG. 1 is a cross-sectional view illustrating an outline of a semiconductor manufacturing apparatus 10 according to the embodiment. Referring to FIG. 1, the semiconductor manufacturing apparatus 10 according to the embodiment includes an ultraviolet generating part disposed in an ultraviolet generating chamber 11 to generate ultraviolet rays of a target wavelength, a chuck 210 disposed in a process chamber 21 where a loaded substrate is treated with the ultraviolet rays to support the loaded substrate, and a chuck driving part 220 which rotates, lifts, and lowers a shaft 220 connected to the chuck 210, and a window 300 disposed between the ultraviolet generating chamber 11 and the process chamber 21 to transmit the generated ultraviolet rays to the process chamber 21.

The ultraviolet generating part 100 generates plasma to generate ultraviolet rays of a target wavelength. In one embodiment, the ultraviolet generating part may include a plasma generating part 110, a gas supply part 120, and a vacuum generating part 130, and for example, may include a reflective member 140 which reflects and provides the generated ultraviolet rays to the process chamber 21.

In one embodiment, the vacuum generating part 130 maintains a vacuum inside the ultraviolet generating chamber 11. For example, the vacuum generating part 130 includes a vacuum pump (not shown) which discharges materials in the ultraviolet generating chamber 11 to the outside of the chamber, a vacuum gauge (not shown) capable of detecting an internal degree of vacuum, a valve (not shown) which controls the inflow and outflow of materials, and a pipe (not shown) which connects components. The vacuum generating part 130 may maintain the degree of vacuum in the ultraviolet generating chamber 11 at $10^{-1}$ to $10^{-4}$ Torr.

The gas supply part 120 provides a gas for generating plasma. The wavelength of the ultraviolet rays generated by the ultraviolet generating part 100 may be adjusted according to the gas provided by the gas supply part 120. For example, the gas supply part 120 may provide gases such as helium (He), oxygen ($O_2$), argon (Ar), and the like and the flow rate of the provided gases may be 10 to 1000 sccm.

The plasma generating part 110 generates plasma in the ultraviolet generating chamber 11. In one embodiment, the plasma generating part 110 is a capacitively coupled plasma (CCP) generation device, and as radio frequency (RF), direct current, and high-frequency to low-frequency electrical signals are provided to two separated metal electrodes disposed in the device, the plasma is generated. In one embodiment, the electrical signals provided to the plasma generating part 110 may be a pulse or continuous wave (CW).

In another embodiment, the plasma generating part 110 is an inductively coupled plasma (ICP) generation device, in which a magnetic field is generated as current flows through a coil located in the device, and the inductively coupled plasma generation device generates plasma from a magnetic field generated in this way. In one embodiment, the electrical signals provided to the plasma generating part 110 are a pulse or continuous wave (CW), and a signal of a band of 1 MHz or more may be provided.

In still another embodiment, the plasma generating part 110 may be a microwave providing device, and may generate plasma by providing an electric signal of an RF band to the ultraviolet generating chamber 11. In one embodiment, the frequency of an electrical signal provided to the plasma generating part 110 is 2.45 GHz or higher, and a pulse or continuous wave may be provided. The plasma generating part 110 may generate plasma as described, and may generate pulse-time-modulated plasma.

Electrons excited in the plasma generated by the plasma generating part 110 descend to a ground state again, and light having energy corresponding to an energy difference between an excited state and the ground state is emitted to the outside. A wavelength band of the light generated in this way may be an infrared region, a visible ray region, and an ultraviolet region, but the energy should be at least greater than or equal to the energy of the ultraviolet band to neutralize charges trapped in the semiconductor substrate and/or the pattern formed on the semiconductor substrate.

The ultraviolet band may be classified into a near ultraviolet (NEAR UV, 300 nm to 380 nm) band, a far ultraviolet (FAR UV, 200 nm to 300 nm) band, and a vacuum ultraviolet (VUV, vacuum UV, 70 nm to 200 nm) band having a shorter wavelength than the far ultraviolet band according the wavelength band, and in a preferable embodiment, the ultraviolet generating part according to the embodiment may generate ultraviolet rays in the vacuum ultraviolet (VUV) band.

The ultraviolet rays generated by the ultraviolet generating part are provided to the process chamber 210 from the ultraviolet generating chamber 11 through the window 300. In one embodiment, the ultraviolet generating part further includes the reflective member 140. Since the ultraviolet rays generated by the ultraviolet generating part are radially radiated, the reflective member 140 reflects and provides the radiated ultraviolet rays in a direction toward a substrate S.

In one embodiment, the reflective member 140 may be a distributed Bragg's reflector (DBR) in which a plurality of material layers having different refractive indices are alternately stacked. Further, a plurality of reflective members 140 may be disposed in the ultraviolet generating chamber 11.

The ultraviolet rays generated by the ultraviolet generating part are transmitted through the window 300 and provided to the process chamber 11. Ultraviolet rays having high energy have high linearity and are absorbed by an air layer of only several centimeters, and thus energy is lost. Accordingly, the window 300 may be formed of a material in which the transmittance of ultraviolet rays of a target wavelength band is high. FIG. 2(*a*) is a view illustrating the transmittance of magnesium fluoride ($MgF_2$), which is one of the materials of the window 300, by ultraviolet wavelength band. Referring to FIG. 2(*a*), it can be seen that magnesium fluoride having a thickness of 5 mm has a transmittance of 70% at a wavelength of 140 nm, and as the wavelength increases from 140 nm to 200 nm, it can be seen that the transmittance increases from 70% to 90%.

FIG. 2(*b*) is a view illustrating the transmittance of calcium fluoride ($CaF_2$), which is one of the materials of the window, by ultraviolet wavelength band. Referring to FIG. 2(*b*), it can be seen that calcium fluoride having a thickness of 5 mm has a transmittance of approximately 65% at a wavelength of 140 nm, and as the wavelength increases from 140 nm to 200 nm, it can be seen that the transmittance increases from 65% to 90%.

Although not shown in the drawings, any one of lithium fluoride (LiF) and sapphire may be used as the material of the window 300. Lithium fluoride (LiF) and sapphire have transmittances in a range similar to those of the magnesium fluoride and the calcium fluoride illustrated in FIGS. 2A and 2B. Accordingly, these materials may be used to form the window 300.

FIG. 3(*a*) is a view illustrating a state in which a pattern is formed on one surface of the window 300. Referring to FIG. 3(*a*), a surface area may be increased by forming the pattern on one or more surfaces of the window 300. A light receiving area may be increased by increasing the surface area of the window 300, and thus the amount of light to be transmitted from the window 300 may be increased. Furthermore, a wave reflected from the surface of the window 300 may be re-incident and transmitted through the rear surface to increase the amount of transmitted light. The pattern formed on the surface of the window 300 may be formed by an etching profile designed according to the structure and characteristics of the substrate S, and this may be applied to improve the efficiency of a process.

FIG. 3(*b*) is a view illustrating a state in which a filter 310 is formed on any one surface of the window 300. In the embodiment illustrated in FIG. 3(*b*), the filter 310 may be a cut-off filter which blocks light of a band other than a target wavelength band. For example, the filter 310 may be formed on one or more surfaces of the window 300 using a method such as coating or the like.

Referring to FIG. 1 again, the substrate S loaded into the process chamber 21 is disposed on the chuck 210. The chuck 210 is driven by a chuck driving part 220 connected to the shaft 222. The chuck 210 fixes and holds the loaded substrate S. For example, a recess and a jaw are formed in the chuck 210, and the substrate S disposed in the recess may be fixed using the jaw. As another example, a suction hole may be formed in the chuck 210, and the chuck 210 may fix the substrate S by suctioning a contact surface with the substrate S using the suction hole. However, this is only one embodiment, and the substrate S may be fixed to the chuck in other ways.

The chuck 210 is connected to the chuck driving part 220 through the shaft 222. The chuck driving part 220 may raise or lower the shaft 222 to raise or lower the chuck 210 on which the substrate S is disposed to adjust the distance from the ultraviolet generating part. In another embodiment, the substrate S may be fixed to the chuck 210 with a spacer (not shown) or a carrier plate (not shown).

Further, the chuck driving part 220 may rotate the shaft 222 to rotate the chuck 210 on which the substrate S is disposed. As will be described below, the ultraviolet rays generated from the ultraviolet generating chamber 11 may be uniformly irradiated onto the substrate S by rotating the shaft.

In an embodiment not shown, a vacuum generating part and a gas supply part may be formed in the process chamber 21. When the process chamber 21 is maintained at atmospheric pressure, the ultraviolet rays provided through the window 300 may be absorbed by air of the process chamber 21 and thus may not be provided to the substrate. Accordingly, the vacuum generating part 130 disposed in the process chamber 21 maintains the degree of vacuum in the process chamber 11 at 100 mT or less.

Further, charged particles such as positive ions, negative ions, and electrons may be needed to neutralize the charges trapped in the substrate S in the process chamber 21. Accordingly, the gas supply part, which injects a target gas, may be formed in the process chamber 21. The gas provided by the gas supply part may be ionized by the energy of the ultraviolet rays which entered the process chamber 21 to generate charged particles.

FIG. 4 is a view illustrating another embodiment of the semiconductor manufacturing apparatus. Referring to FIG. 4, a plurality of ultraviolet generating parts 100 may be positioned in the ultraviolet generating chamber 11. As the wavelength of the ultraviolet rays generated by the ultraviolet generating parts 100 becomes shorter, the linearity of the ultraviolet rays increases, and thus it may difficult to uniformly irradiate the ultraviolet ray to the entire area of the substrate S. Accordingly, in the embodiment, the plurality of ultraviolet generating parts 100 may be disposed to perform ultraviolet treatment on the substrate S.

In the embodiment illustrated in FIG. 4, the ultraviolet generating parts 100 may be separated by blocking walls 600. In the illustrated embodiment, the blocking walls 600 and the window 300 do not come into contact with each other, but in an embodiment not shown, the blocking walls 600 and the window 300 come into contact with each other. Further, the ultraviolet generating parts 100 may respectively generate ultraviolet rays of different wavelengths and provide the ultraviolet rays to the substrate S.

FIGS. 5A to 5D are plan views of embodiments of the window 300. FIG. 5(*a*) illustrates a state in which the window 300 is formed of a single material which is not separated. The window 300 may be supported by a frame 310. FIG. 5(*b*) illustrates a case in which one window is divided into a center region 300*a* and a peripheral region 300*b*, and both the center region 300*a* and the peripheral region 300*b* may be supported by the frame 310.

As illustrated in FIG. 1, since the chuck 210 to which the substrate S is fixed rotates by the chuck driving part 220, the substrate S rotates around the shaft 222 as the chuck 210 rotates. Accordingly, as the substrate S rotates, the ultraviolet rays provided through the window 300 may be provided to the entire front surface of the substrate. Referring to FIG. 5(*c*), a center of one window 300 may be eccentrically disposed from the center C around which the substrate rotates, and the diameter of the window 300 may be greater than or equal to the radius of the substrate S. Accordingly, although the diameter of the window 300 is smaller than the diameter of the substrate S, as the substrate S rotates, the ultraviolet rays are provided to the entire surface of the substrate.

Referring to FIG. 5(*d*), the window may include a plurality of window elements 300*d*, 300*e*, and 300*f* each having a smaller diameter than the radius of the substrate S. The plurality of window elements may be positioned to be eccentric from the rotation center C of the substrate. Accordingly, although the diameter of the window 300 is smaller than the diameter of the substrate S, as the substrate S rotates, the ultraviolet rays are provided to the entire surface of the substrate. The window elements 300*d*, 300*e*, and 300*f* may be disposed so that there is no portion of the substrate to which ultraviolet rays are not provided when the substrate rotates. Further, since the amount of charges trapped near the center C of the substrate S is large, the window element 300*e* may be disposed so that a large amount of ultraviolet rays may be irradiated to the center portion.

Hereinafter, a preferable implementation example of the semiconductor manufacturing apparatus will be described with reference to the accompanying drawing. The implementation example further includes a grid plate 300. FIG. 6 is an exploded perspective view illustrating an outline of the grid plate, and FIG. 7 is a view schematically illustrating a process of manufacturing a first grid electrode 410. Referring to FIGS. 6 and 7, the grid plate 400 may include only the first grid electrode 410 having a circular structure illustrated in FIG. 6(*a*), and furthermore, may further include a second grid electrode 420 and a third grid electrode 430.

As illustrated in FIG. 6(*a*), the grid plate 400 includes a plurality of electrode lines LX formed of a conductive material including a metal material such as aluminum (Al), copper (Cu), or the like or graphite such as carbon, or the like disposed on an insulating layer 411 such as polyimide (PI), epoxy, or the like.

The first grid electrode 410 includes a plurality of electrode lines LX. The electrode lines LX may be formed by patterning metal layers 412 so that the metal layers 412 may have different radii, and may be formed by forming a plurality of holes H having a predetermined diameter in the patterned metal layers 412.

The second grid electrode 420 includes a plurality of electrode lines LY formed of a conductive material and formed to be spaced apart from each other at a predetermined distance apart in a first direction, and the third grid electrode 430 includes electrode lines LZ formed of a conductive material and formed to be spaced apart from each other at a predetermined distance apart in a second direction.

The conductive electrode lines LX spaced apart from each other, the conductive electrode lines LY, and the conductive electrode lines LZ are spaced apart from each other at a predetermined distance, and are stacked and disposed so as not to electrically come into contact with each other. Here, the positions of the first grid electrode 410, the second grid electrode 420, and the third grid electrode 430 may be changed with each other.

In the first grid electrode 410, since the plurality of electrode lines LX having different radii and a plurality of insulating layers are alternately disposed, the electrode lines may be insulated from each other and a plurality of holes may be respectively formed in the electrode lines.

The first grid electrode 410 may be formed on the insulating layer 411. Further, a thickness of the insulating layer 411 may be 1 mm to 30 mm, a thickness of the metal layer 412 may be 1 to 10 mm, and a width of the electrode line LX formed on the metal layer 412 may be 10 mm to 50 mm A separation distance between the electrode lines LX may be 10 mm to 50 mm. The electrode line LX at a center portion of the metal layer 412 may be configured to have a predetermined area so that more holes H may be formed in the center portion of the first grid electrode 410, and the diameter of the hole H may be set to a size of 0.1 to 5 mm.

A center portion of the insulating layer 411 may be provided with a metal plate formed of copper (Cu), aluminum (Al), or the like. This may increase adhesion and strengthen the grid electrode during plating of a wall of the hole H.

Further, a separation distance between the first grid electrode 410 and the second grid electrode 420 adjacent to the first grid electrode 410 may be a separation distance greater than or equal to a predetermined distance so that ions or electrons emitted through the holes H of the first grid electrode 410 may be introduced into the second grid electrode 420 in a state of being diffused in a predetermined range.

Each of the electrode lines LX of the first grid electrode 410, each of the electrode lines LY of the second grid electrode 420, and each of the electrode lines LZ of the third grid electrode 430 are connected to grid control devices 500. That is, the grid control devices 500 independently supply power to the electrode lines LX, LY, and LZ.

Further, the first to third grid electrodes 410, 420, and 430 are fixed to the inside of the chamber by a support means (not shown) provided in the process chamber 21 and disposed to form a predetermined separation distance, or the separation distance is formed by additionally providing a spacer (not shown) having a height corresponding to a separation distance in predetermined units including the edge portions between the first to third grid electrodes 410, 420, and 430 or edge portions, and thus are disposed and stacked to be electrically insulated.

In the first grid electrode 410, a plurality of circular electrode lines LX having predetermined areas in the form of ellipses or concentric circles having different diameters are disposed to be spaced apart from each other at a predetermined distance in an outward direction based on the same center point. Accordingly, the first grid electrode 410 may be formed to correspond to a static electricity pattern formed on a semiconductor substrate 1.

The electrode lines LY and LZ of the second and third grid electrodes 420 and 330 are disposed to form an arbitrary crossing angle in a range of 10° to 90°. When viewed from above, as illustrated in FIG. 6(B), since the electrode lines of the second grid electrode 410 and the third grid electrode 420 cross each other, a mesh shape is formed. Preferably, the electrode lines of the second and third grid electrodes 420 and 430 may be formed in an X-axis direction and a Y-axis direction to form a grid pattern.

Meanwhile, FIG. 8 is a view illustrating a shape in which the first to third grid electrodes 410, 420, and 430 are disposed and stacked, when viewed from above. Referring to FIG. 8, as the holes H formed in the electrode lines LX of the first grid electrode 410 and the electrode lines LY and LZ of the second and third grid electrodes 420 and 430 cross each other, ions or electrons disposed at the upper side of the grid plate 500 are emitted to the lower side through the holes H formed in the electrode lines LX.

That is, as shown in FIG. 8, as a result of measuring the electrostatic characteristics of the semiconductor substrate 1 after a semiconductor process is completed, when a first electrostatic region T1 of a positive voltage and a second electrostatic region T2 of a negative voltage are present, a negative voltage which is a reverse voltage of the first electrostatic region T1 is supplied to electrode lines LX4, LX5, LY7, LY8, LY9, LZ1, LZ2, and LZ3 corresponding to the first electrostatic region T1, and a positive voltage which is a reverse voltage of the second electrostatic region T2 is supplied to electrode lines LX1, LX2, LY2, LY3, LY4, LZ5, LZ6, and LZ7 corresponding to the second electrostatic region T3.

For example, as ions or electrons of different intensities are emitted to electrostatic regions of different voltages formed at different positions on the semiconductor substrate 1 by supplying a reverse voltage of "−20 V" to the electrode lines of the first electrostatic region T1, which is "+20 V," and supplying a reverse voltage of "+50 V" to the electrode lines of the second electrostatic region T2, which is "−50 V," static electricity of different characteristics generated in different regions is removed at the same time.

Further, in FIG. 8, a voltage having an opposite polarity to the corresponding electrostatic voltage and a level different from that of the electrostatic voltage by less than a predetermined level may be supplied to the electrode lines corresponding to the first electrostatic region T1 and the second electrostatic region T2. This may be appropriately set in consideration of a distance between the grid plate 500 and the semiconductor substrate 1 and a decrease in intensity of ions or electrons in the semiconductor substrate 1.

Hereinafter, an operation of the semiconductor manufacturing apparatus according to the above-described preferable implementation example will be described with reference to FIG. 9. The vacuum generating part 130 is driven so that the inside of the ultraviolet generating chamber 11 has a target degree of vacuum. As described above, in one embodiment, the ultraviolet generating chamber 11 is maintained at $10^{-1}$ to $10^{-4}$ Torr. The gas supply part 120 injects a gas so that the target ultraviolet generating part generates a wavelength of an ultraviolet ray.

As described above, the process chamber 21 may also include a vacuum generating part and a gas injection part, the vacuum generating part included in the process chamber 21 is also provided so that the process chamber has a target degree of vacuum, and the gas injection part injects gases so that charged particles are generated from the ultraviolet rays introduced into the process chamber 21.

The following Table 1 is a table illustrating the gases injected when plasma is generated and the wavelength of the ultraviolet rays generated according to injection of the gas.

TABLE 1

| Helium (He) | Oxygen ($O_2$) | Argon (Ar) |
|---|---|---|
| 58.4 nm | 130.5 nm | 104.8 nm |

Electrons in an excited state descend to the ground state to generate ultraviolet rays having the corresponding wavelength at the same time as plasma is generated by providing a target gas to the ultraviolet generating part 100. The generated ultraviolet rays directly pass through the window 300 or are reflected by the reflective member 140, and are provided to the substrate S through the window 300. As described above, the substrate S is moved as the distance from the window 400 and a rotation speed of the substrate S are controlled by the chuck driving part 220.

When the ultraviolet rays are provided to the surface of the substrate S, the charges trapped on the surface of the substrate S and multi-layered film fine patterns formed on the substrate S are neutralized. For example, it is assumed that a silicon oxide film is generated on the substrate S and the electrons are trapped in the silicon oxide film.

A silicon oxide film generally has a band gap energy of 8.4 eV to 11 eV, and in order to neutralize the electrons trapped in the silicon oxide film by holes, ultraviolet rays having an energy corresponding to at least the band gap should be irradiated so that the holes cross the forbidden band and enter the conduction band to neutralize the electrons.

Further, as ultraviolet rays are irradiated into the process chamber 21, the gas in the process chamber 21 is ionized by the ultraviolet rays and generates charged particles. The grid plate 400 may receive power from the grid plate controller 500, and may accelerate and provides the charged particles generated in this way to the substrate S to neutralize the static electricity generated on the substrate S.

The grid plate controller 500 may receive information on a region where a large amount of static electricity is disposed on the substrate S, and may provide the corresponding charged particles to neutralize the static electricity generated on the substrate S with high efficiency.

Although the embodiments shown in the drawings are described as a reference for helping understanding of the present invention, they are embodiments for implementation, and merely exemplary, and those skilled in the art will understand that various modifications and equivalents are possible therefrom. Accordingly, the true technical scope of the present invention should be defined by the appended claims.

The invention claimed is:

1. A semiconductor manufacturing apparatus, comprising:

an ultraviolet generating part disposed in an ultraviolet generating chamber to generate ultraviolet rays of a target wavelength;

a substrate driving part including a chuck disposed in a process chamber where a loaded substrate is treated with the ultraviolet rays to support the loaded substrate, and a shaft configured to rotate the chuck;

a window disposed between the ultraviolet generating chamber and the process chamber to transmit the generated ultraviolet rays to the process chamber; and a grid plate having a stacked structure of a plurality of layers and an insulator layer disposed between each of the plurality of layers, the grid plate configured to accelerate and provide charged particles through the grid plate to the substrate, wherein the grid plate includes a plurality of electrode lines having different radii, and a grid electrode in which a plurality of holes are respectively formed in the electrode lines, and a grid plate controller configured to supply a voltage corresponding to an electrostatic voltage generated on the substrate to the grid plate.

2. The semiconductor manufacturing apparatus of claim 1, wherein the ultraviolet generating part further includes one or more reflective members configured to reflect the generated ultraviolet rays to the process chamber.

3. The semiconductor manufacturing apparatus of claim 1, wherein the ultraviolet generating part generates plasma to generate the ultraviolet rays of the target wavelength, and includes a plasma generating part, a gas supply part, and a vacuum generating part forming a vacuum inside the ultraviolet generating chamber.

4. The semiconductor manufacturing apparatus of claim 3, wherein the gas supply part provides one or more of helium (He), oxygen ($O_2$), and argon (Ar) gases.

5. The semiconductor manufacturing apparatus of claim 3, wherein the ultraviolet generating part generates pulse-time-modulated plasma to generate the ultraviolet rays of the target wavelength.

6. The semiconductor manufacturing apparatus of claim 3, wherein the plasma generating part includes any one of a capacitively coupled plasma (CCP) generator, an inductively coupled plasma generator, and a microwave application device.

7. The semiconductor manufacturing apparatus of claim 1, wherein, in the window, a pattern is formed on at least one surface of the window, or a filter is formed on at the least one surface of the window.

8. The semiconductor manufacturing apparatus of claim 1, wherein at least a portion of the window is formed of a material including any one of sapphire, magnesium fluoride ($MgF_2$), calcium fluoride ($CaF_2$), and lithium fluoride (LiF).

9. The semiconductor manufacturing apparatus of claim 1, comprising a plurality of ultraviolet generating parts.

10. A semiconductor manufacturing apparatus, comprising:

an ultraviolet generating part disposed in an ultraviolet generating chamber to generate ultraviolet rays of a target wavelength;

a substrate driving part including a chuck disposed in a process chamber where a loaded substrate is treated with the ultraviolet rays to support the loaded substrate, and a shaft configured to rotate the chuck;

a window disposed between the ultraviolet generating chamber and the process chamber to transmit the generated ultraviolet rays to the process chamber; and a grid plate having a stacked structure of a plurality of layers and an insulator layer disposed between each of the plurality of layers, the grid plate configured to accelerate and provide charged particles through the grid plate to the substrate, wherein the grid plate includes a plurality of electrode lines having different radii, and a grid electrode in which a plurality of holes are respectively formed in the electrode lines, and a grid plate controller configured to supply a voltage corresponding to an electrostatic voltage generated on the substrate to the grid plate.

11. The semiconductor manufacturing apparatus of claim 10, wherein the grid plate further includes a grid electrode extending in a first direction, and a grid electrode extending in a second direction which is a direction different from the first direction.

* * * * *